(12) United States Patent
Park et al.

(10) Patent No.: US 10,986,014 B2
(45) Date of Patent: Apr. 20, 2021

(54) MONITORING SYSTEM AND NON-TRANSITORY COMPUTER-READABLE RECORDING MEDIUM STORING MONITORING PROGRAM

(71) Applicant: KYOCERA Document Solutions Inc., Osaka (JP)

(72) Inventors: Dukil Park, Osaka (JP); Kazuki Nishikai, Osaka (JP); Koki Nakajima, Osaka (JP); Yasuo Nakashima, Osaka (JP); Satoshi Goshima, Osaka (JP); Yuichi Obayashi, Osaka (JP); Takeshi Nakamura, Osaka (JP)

(73) Assignee: KYOCERA DOCUMENT SOLUTIONS INC., Osaka (JP)

( * ) Notice: Subject to any disclaimer, the term of this patent is extended or adjusted under 35 U.S.C. 154(b) by 0 days.

(21) Appl. No.: 16/893,681

(22) Filed: Jun. 5, 2020

(65) Prior Publication Data

US 2020/0389362 A1 Dec. 10, 2020

(30) Foreign Application Priority Data

Jun. 7, 2019 (JP) .............................. JP2019-106996

(51) Int. Cl.
| | |
|---|---|
| *H04L 12/26* | (2006.01) |
| *H04L 12/24* | (2006.01) |
| *H03M 13/15* | (2006.01) |
| *H04L 29/08* | (2006.01) |
| *G06K 9/00* | (2006.01) |

(52) U.S. Cl.
CPC ........ *H04L 43/50* (2013.01); *H03M 13/1515* (2013.01); *H04L 41/064* (2013.01); *H04L 41/142* (2013.01); *G06K 9/00536* (2013.01); *H04L 41/065* (2013.01); *H04L 43/045* (2013.01); *H04L 43/067* (2013.01); *H04L 67/22* (2013.01)

(58) Field of Classification Search
CPC ... H04L 41/064; H04L 41/065; H04L 43/045; H04L 43/067; H04L 43/50; H04L 9/085; H04L 9/0894; H04L 69/40; H04L 67/22; G06F 11/2094; G06F 11/1092; G06F 3/0619; G06F 3/0644; G06F 3/0608; G06F 3/0659; G06F 3/0652; H03M 13/1515; G06K 9/00536
See application file for complete search history.

(56) References Cited

U.S. PATENT DOCUMENTS

| | | | |
|---|---|---|---|
| 2008/0140751 A1* | 6/2008 | Ide ..................... | G06K 9/00536 708/520 |
| 2017/0075762 A1* | 3/2017 | Hendrickson ..... | H03M 13/1515 |
| 2017/0155570 A1* | 6/2017 | Maheshwari .......... | H04L 43/50 |

FOREIGN PATENT DOCUMENTS

JP 2013-242902 12/2013

* cited by examiner

*Primary Examiner* — Kyung H Shin
(74) *Attorney, Agent, or Firm* — Lex IP Meister, PLLC (57) ABSTRACT

A monitoring system detects a deviation in a monitoring metric of a system component of a remote management system that remotely manages image forming apparatuses. When the monitoring system detects a deviation in online device count greater than or equal to a deviation threshold and makes a determination that there is a correlation between the deviations in monitoring metrics of multiple system components as detected, the monitoring system sends a failure report indicating that a failure is in the remote management system.

6 Claims, 7 Drawing Sheets

MONITORING SYSTEM AND NON-TRANSITORY COMPUTER-READABLE RECORDING MEDIUM STORING MONITORING PROGRAM

INCORPORATION BY REFERENCE

This application is based upon, and claims the benefit of priority from, corresponding Japanese Patent Application No. 2019-106996 filed in the Japan Patent Office on Jun. 7, 2019, the entire contents of which are incorporated herein by reference.

BACKGROUND

Field of the Invention

The present disclosure relates to a monitoring system for a specific system and a non-transitory computer-readable recording medium storing a monitoring program.

Description of Related Art

It is known from the conventional techniques to detect a failure in a system and report the detected failure based on the interrelationship of metrics of components of the system. However, in the conventional techniques, the burden of processing is large due to the need to constantly calculate the interrelationship of metrics of components of the system.

SUMMARY

A monitoring system of the present disclosure includes a deviation detector that detects deviations in metrics of components of a specific system, a correlation determiner that determines whether there is a correlation between the deviations in the metrics of the components as detected by the deviation detector, and a reporter that sends a failure report indicating that there is a failure in the specific system when the deviation detector detects a deviation in a metric of a specific component, the deviation being greater than or equal to a specific threshold, and the correlation determiner makes a determination that there is a correlation between the deviations of the metrics of the components.

In the monitoring system of the present disclosure, the specific system may include a system to perform remote management of electronic devices. At least one metric of the specific component may be an online device count as a number of electronic devices connected with the specific system. The reporter may send the failure report when the deviation detector detects a deviation in the online device count that is greater than or equal to a specific threshold and the correlation determiner makes the determination that there is a correlation between the deviations in the metrics of the components.

In the monitoring system of the present disclosure, the deviation detector may detect the deviations in the metrics by using singular spectrum transformation on the metrics.

In the monitoring system of the present disclosure, the reporter may send a failure possibility report indicating that there is a possibility of a failure in the specific system when the deviation in the metric of the specific component as detected by the deviation detector is greater than or equal to the specific threshold and the correlation determiner makes a-determination that there is no correlation between the deviations in the metrics of the components.

In the monitoring system of the present disclosure, when the correlation determiner makes the determination that there is a correlation between the deviations in the metrics of the components as detected by the deviation detector, the correlation determiner may determine whether the determination is trustworthy, based on the deviations in the metrics of the components. When the determination is determined by the correlation determiner not to be trustworthy, the reporter may not send the failure report even if the deviation in the metric of the specific component as detected by the deviation detector is greater than or equal to the specific threshold and the correlation determiner makes the determination that there is a correlation between the deviations in the metrics of the components.

A non-transitory computer-readable recording medium of the present disclosure stores a monitoring program which, when executed by a computer, causes the computer to implement a deviation detector to detect deviations in metrics of components of a specific system, a correlation determiner to determine whether there is a correlation between the deviations in the metrics of the components as detected by the deviation detector, and a reporter to send a failure report indicating that there is a failure in the specific system when the deviation detector detects a deviation in a metric of a specific component, the deviation being greater than or equal to a specific threshold, and the correlation determiner makes a determination that there is a correlation between the deviations in the metrics of the components.

BRIEF DESCRIPTION OF THE DRAWINGS

FIG. 1 is a block diagram of a system according to an embodiment of the present disclosure;

FIG. 2 is a block diagram of a remote management system shown in FIG. 1;

FIG. 3 is a block diagram of a monitoring system shown in FIG. 1, which is constructed of one computer in the illustrated example;

FIG. 4 is a diagram showing an example of a failure derivation pattern contained in failure detection information shown in FIG. 3;

FIG. 5 is a flowchart showing operations, which the monitoring system shown in FIG. 3 takes when detecting deviations of monitoring metrics other than the online device count;

FIG. 6A is a graph showing an example of the online device count as a time series;

FIG. 6B is a graph showing the deviation of the online device count in FIG. 6A as a time series; and FIG. 7 is a flowchart showing operations, which the monitoring system shown in FIG. 3 takes when detecting the deviation of the online device count.

DETAILED DESCRIPTION

Below, an embodiment of the present disclosure will be described using the figures.

First, the system will be described according to an embodiment of the present disclosure.

Figure 1:
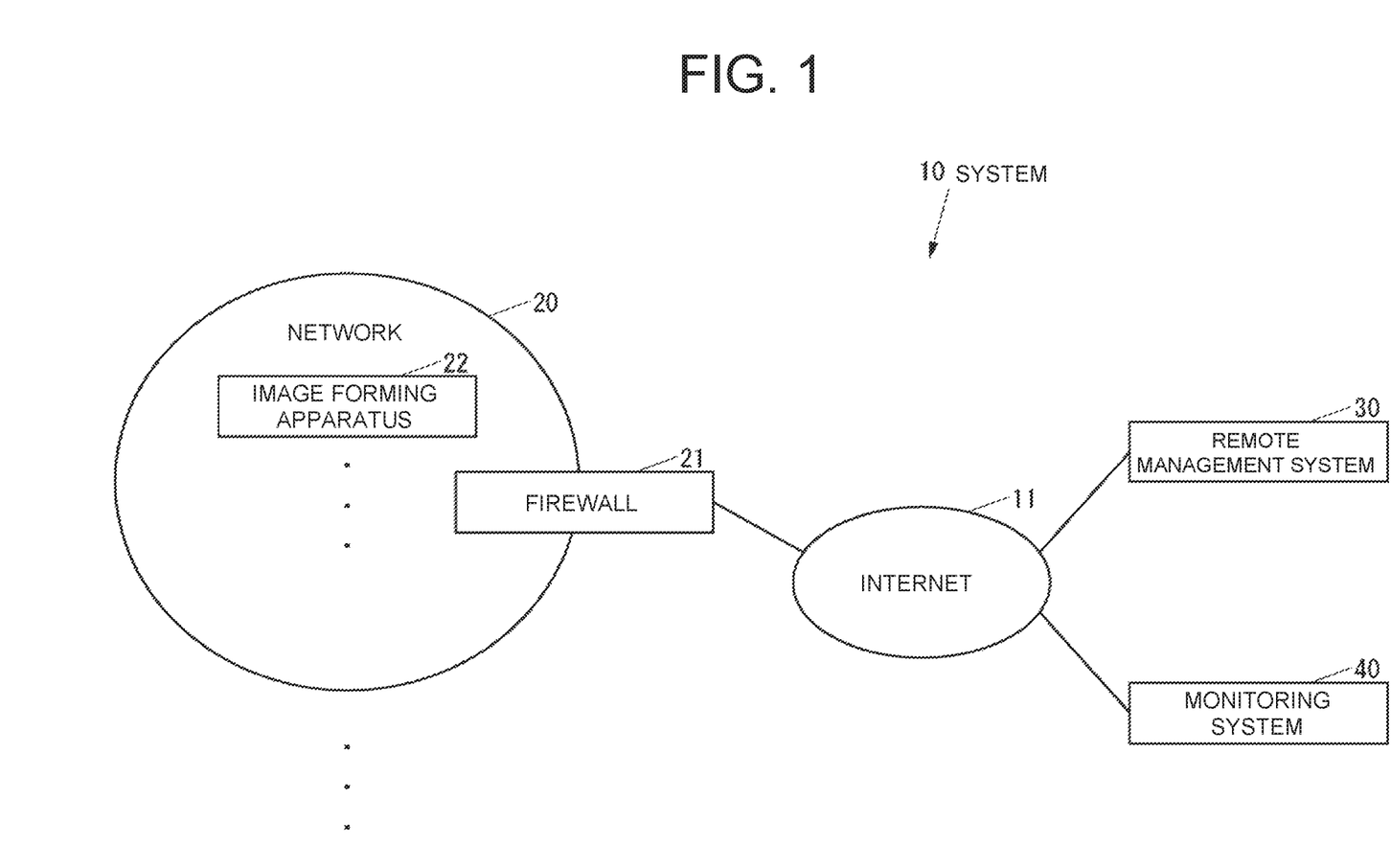

FIG. 1 is a block diagram of a system according to an embodiment of the present disclosure.

As shown in FIG. 1, a system 10 includes a network 20 such as a local area network (LAN) of a customer of a company (hereinafter referred to as "management company") that manages image forming apparatuses as electronic devices. Aside from the network 20, the system 10 may also include at least one network with the same structure as the network 20.

The network 20 includes a firewall 21, which controls communications between the inside of the network 20 and the outside of the network 20. The network 20 also includes an image forming apparatus 22. Aside from the image forming apparatus 22, the network 20 may include at least one image forming apparatus having the same structure as the image forming apparatus 22. In the network 20, image forming apparatuses are each a multifunction peripheral (MFP) or a dedicated printer, for instance, and are used by customers of the management company.

The system 10 includes a remote management system 30, which is a specific system that performs remote management of respective image forming apparatuses in the system 10. The remote management system 30 can manage an enormous number, such as several millions, of image forming apparatuses distributed around the world. The remote management system 30 is used by the management company. The remote management system 30 may include one computer, or multiple computers. In the following, the remote management system 30 is assumed to operate on a cloud platform of a public cloud.

Since the remote management system 30 can have many connections with image forming apparatuses over the Internet 11, the capacity of a server constituting the remote management system 30 is expanded responsively along with the increase in number of image forming apparatuses connected with the remote management system 30. Further, the cloud platform, on which the remote management system 30 operates, may be subject to system failure or maintenance and, accordingly, part of the system may go down at times unknown to the remote management system 30.

The system 10 includes a monitoring system 40 that monitors the remote management system 30. The monitoring system 40 is used by the management company. The monitoring system 40 may include one computer, or multiple computers.

In the system 10, respective networks, the remote management system 30, and the monitoring system 40 are capable of communicating with each other over the Internet 11.

Figure 2:
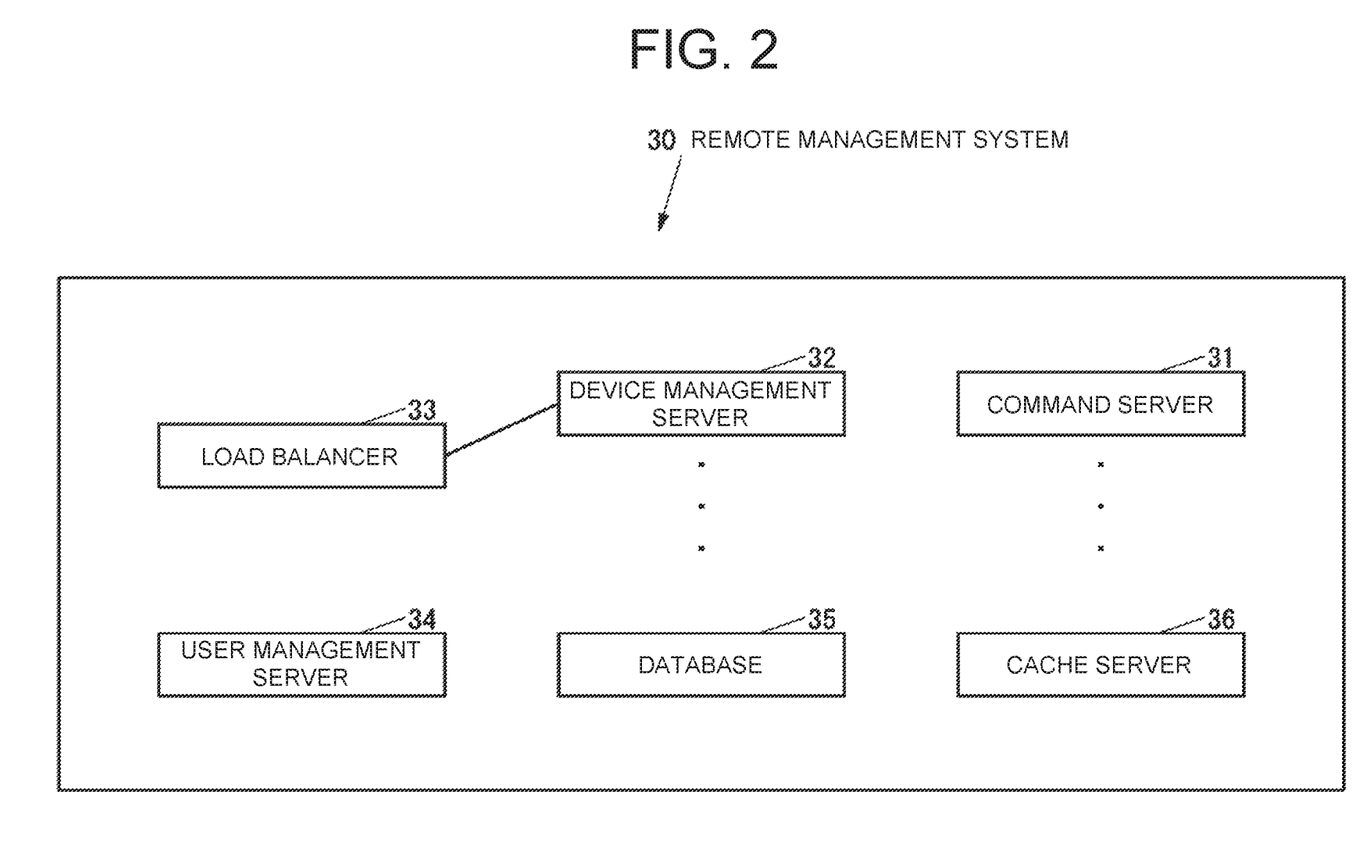

FIG. 2 is a block diagram of the remote management system 30.

As shown in FIG. 2, the remote management system 30 includes a command server 31, which issues control commands to image forming apparatuses. Aside from the command server 31, the remote management system 30 may include at least one command server having the same structure as the command server 31. When a command server establishes a connection with an image forming apparatus, the command server can escape the firewall to issue control commands to the image forming apparatus. One command server can be connected with, for example, 4000 image forming apparatuses simultaneously.

The remote management system 30 includes a device management server 32. When an image forming apparatus has escaped the firewall and connected to the remote management system 30, the device management server 32 processes information transmitted from the image forming apparatus that is required for the management of the image forming apparatus and instructs the image forming apparatus to establish a connection with an appropriate command server. An appropriate command server refers to, for example, a command server with the smallest number of established connections with image forming apparatuses.

Aside from the device management server 32, the remote management system 30 may include at least one device management server having the same structure as the device management server 32. One device management server can execute processing for, for example, 2000 image forming apparatuses per minute.

The remote management system 30 includes a load balancer 33. When an image forming apparatus has escaped the firewall and connected to the remote management system 30, the load balancer 33 assigns information transmitted from the image forming apparatus that is required for the management of the image forming apparatus to an appropriate device management server so as to disperse the load.

The remote management system 30 includes a user management server 34, which accepts, from users including a service person of a management company, operations for performing various remote operations of an image forming apparatus, such as acquiring various types of information from the image forming apparatus, updating the control software of the image forming apparatus, and specifying various settings of the image forming apparatus. The command server 31 delivers the operations accepted by the user management server 34 to the image forming apparatus as control commands, thus performing maintenance of the image forming apparatus.

The remote management system 30 includes a database 35 and a cache server 36, which store various types of information collected by the command server from image forming apparatuses, such as information related to the print count or the authentication of the image forming apparatuses.

As an example, the database 35 stores the history of the number of image forming apparatuses connected with the command server (hereinafter referred to as "online device count"), the history of the usage of central processing units (CPUs) in servers constituting respective components of the remote management system 30 (hereinafter referred to as "system components"), including the command server, the device management server, the user management server 34, the database 35 and the cache server 36, and the history of the usage of memories in the servers constituting the respective system components.

Figure 3:
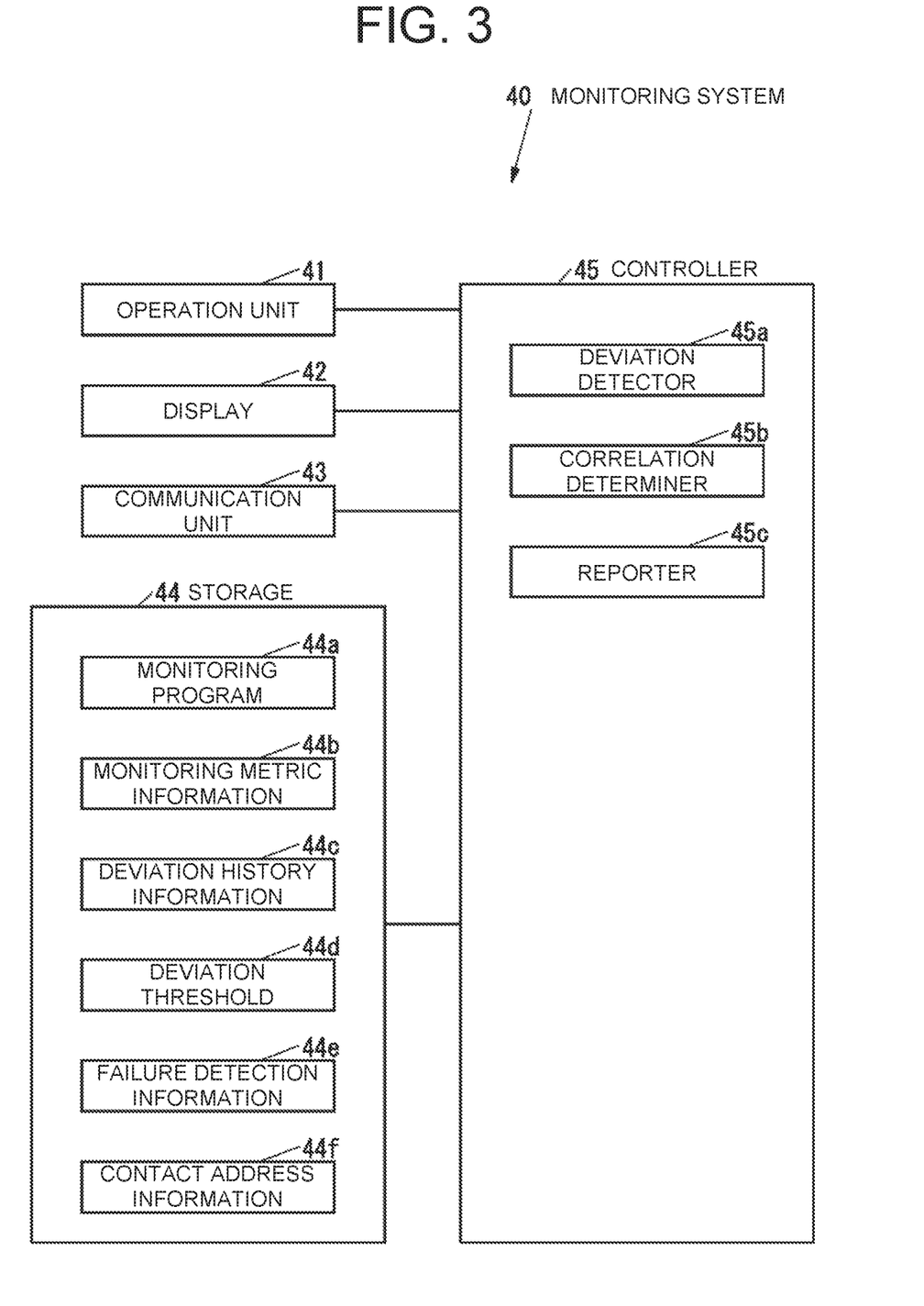

FIG. 3 is a block diagram of the monitoring system 40 as shown in FIG. 1, which is constructed of one computer in the illustrated example.

The monitoring system 40 shown in FIG. 3 includes an operation unit 41 as an operation device, such as a keyboard or a mouse, through which various operations are input, and a display 42 as a displaying device such as a liquid crystal display (LCD) that displays various types of information. The monitoring system 40 also includes a communication unit 43 as a communication device that communicates with external devices over a network, such as a LAN or the Internet 11, or with no networks but through a direct wired or wireless connection. The monitoring system 40 also includes a storage 44 as a non-volatile storage device, such as a semiconductor memory or a hard disk drive (HDD), that stores various types of information, and a controller 45 which controls the monitoring system 40 as a whole.

The storage 44 stores a monitoring program 44a for monitoring the remote management system 30 (see FIG. 2). The monitoring program 44a may be installed in the monitoring system 40 during the manufacture of the monitoring system 40, or may additionally be installed in the monitoring system 40 from an external recording medium such as a compact disc (CD), a digital versatile disc (DVD) or a universal serial bus (USB) memory, or may additionally be installed in the monitoring system 40 over a network.

The storage 44 stores monitoring metric information 44b, which contains metrics utilized for the monitoring of the remote management system 30 (hereinafter referred to as "monitoring metrics"). The monitoring metric information 44b can contain at least one monitoring metric for each system component. The monitoring metrics to be contained in the monitoring metric information 44b may be changed or given new settings based on instructions through the operation unit 41 or the communication unit 43. Examples of the monitoring metrics include the online device count, the usage of CPUs in servers constituting the respective system components, the amount of input to a device management server over the Internet 11 and output from the device management server over the Internet 11 (hereinafter referred to as "network IN/OUT amount"), and the number of transactions of the database 35.

The storage 44 stores deviation history information 44c, which contains the history of deviations of the monitoring metrics. The deviation history information 44c contains the history of deviations for each monitoring metric.

The storage 44 stores a threshold (hereinafter referred to as "deviation threshold") 44d of the deviation in the online device count. The deviation threshold 44d may be changed based on instructions through the operation unit 41 or the communication unit 43.

The storage 44 stores information (hereinafter referred to as "failure detection information") 44e for the detection of failures in the remote management system 30. In the failure detection information 44e, pathways of propagation of the derivation of failures in the remote management system 30 between the system components (hereinafter referred to as "derivation propagation pathways") and, out of the monitoring metrics contained in the monitoring metric information 44b, monitoring metrics of the system components in respective stages in a derivation propagation pathway are contained for each pattern of the derivation of failures in the remote management system 30 between the system components (hereinafter referred to as "failure derivation pattern"). The information for each failure derivation pattern in the failure detection information 44e may be changed or given new settings based on instructions through the operation unit 41 or the communication unit 43.

Figure 4:
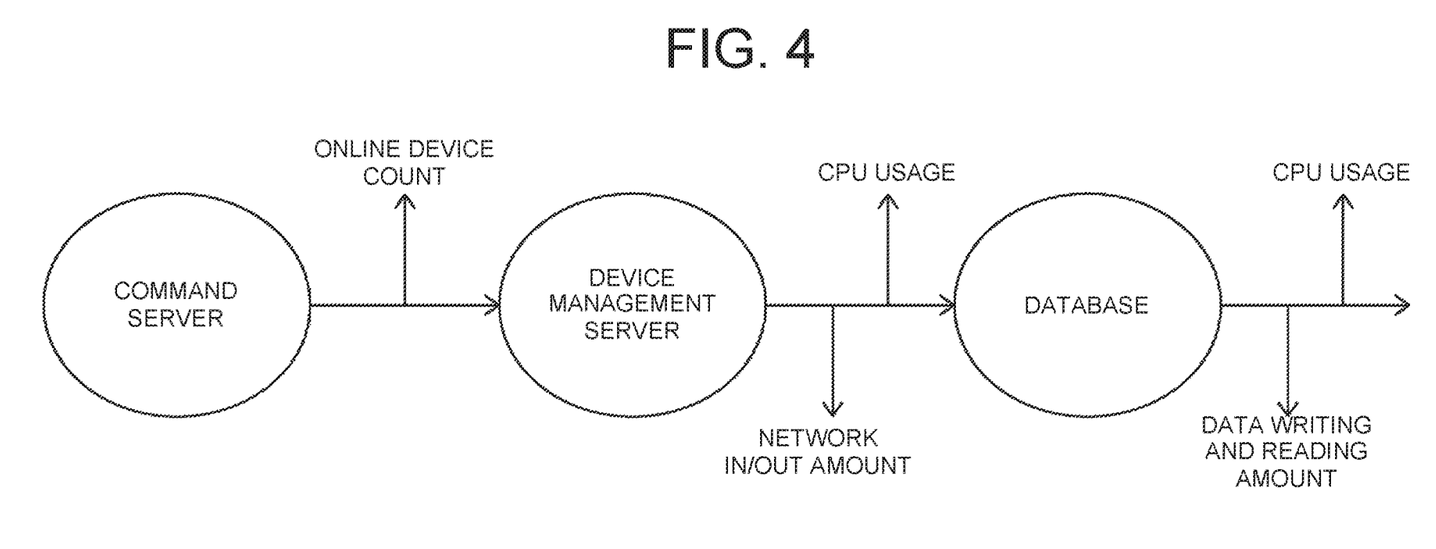

FIG. 4 is a diagram showing an example of a failure derivation pattern contained in the failure detection information 44e.

The failure derivation pattern shown in FIG. 4 is a failure derivation pattern when the online device count decreases.

In the failure derivation pattern shown in FIG. 4, the system component in the first stage of the derivation propagation pathway is the command server, with the online device count being the monitoring metric of the command server. If the online device count is considerably decreased by a breakage of the connection between the remote management system 30 and image forming apparatuses due to some failure, processing for reconnecting the image forming apparatuses to the remote management system 30 is enlarged. An enlarged processing for reconnecting the image forming apparatuses to the remote management system 30 increases the load on the device management server for the establishment of connection between the image forming apparatuses and the command server.

Thus, in the failure derivation pattern shown in FIG. 4, the system component in the second stage of the derivation propagation pathway is the device management server, with the network IN/OUT amount and the usage of the CPU in the device management server being the monitoring metrics of the device management server. When the processing for reconnecting the image forming apparatuses and the command server by the device management server is enlarged, the device management server executes such processes as reading, from the database 35, information for the authentication of an image forming apparatus that has requested reconnection, writing, in the database 35, that an image forming apparatus has been reconnected to the command server when the image forming apparatus has been reconnected to the command server, and writing, in the database 35, various types of current information of the image forming apparatus as reconnected to the command server that is transmitted from the image forming apparatus, so that the load on the database 35 is increased.

Thus, in the failure derivation pattern shown in FIG. 4, the system component in the third stage of the derivation propagation pathway is the database 35, with the amount of data writing in and date reading from the database 35 and the usage of the CPU in the database 35 being the monitoring metrics of the database 35.

As shown in FIG. 3, the storage 44 stores contact address information 44f, which contains a contact address for various types of information. The contact address to be contained in the contact address information 44f is, for example, an electronic mail address. The contact address information 44f may contain multiple contact addresses, such as the contact address of the developer of the remote management system 30 and the contact address of a user of the remote management system 30.

The controller 45 includes, for example, a CPU, a read only memory (ROM) storing programs and various data, and a random access memory (RAM) which is a memory used as a workspace for the CPU of the controller 45. The CPU of the controller 45 executes programs stored in the storage 44 or in the ROM of the controller 45.

The controller 45 executes the monitoring program 44a to implement a deviation detector 45a that detects deviations of the monitoring metrics of the system components of the remote management system 30, a correlation determiner 45b that determines whether there is a correlation between the deviations of the monitoring metrics of the system components, and a reporter 45c that sends failure reports indicating that there is a failure in the remote management system 30.

Next, the operations of the monitoring system 40 will be described.

Figure 5:
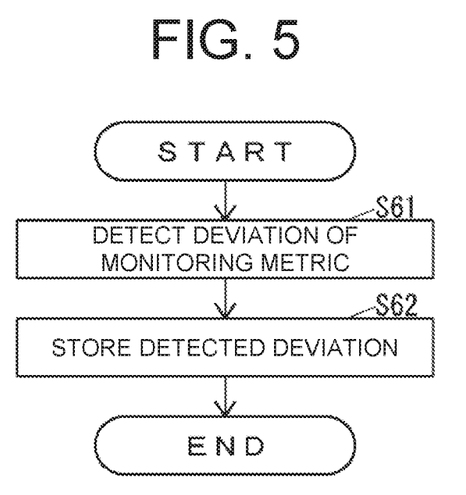

FIG. 5 is a flowchart showing the operations, which the monitoring system 40 takes when detecting the deviation of monitoring metrics other than the online device count.

The controller 45 of the monitoring system 40 regularly executes the operations shown in FIG. 5 for each monitoring metric.

As shown in FIG. 5, the deviation detector 45a detects a deviation of the selected monitoring metric (S61). This means, the deviation detector 45a acquires the deviation of the selected monitoring metric through calculation.

Figure 6A:
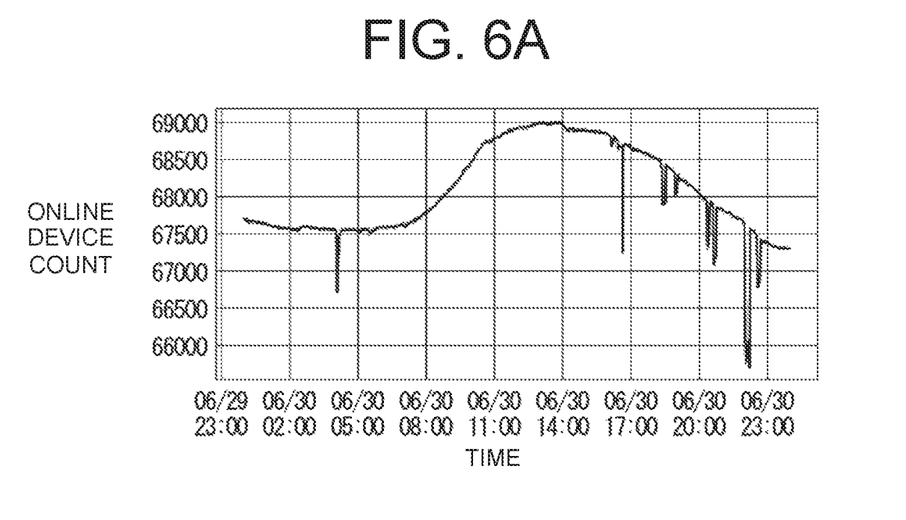
Figure 6B:
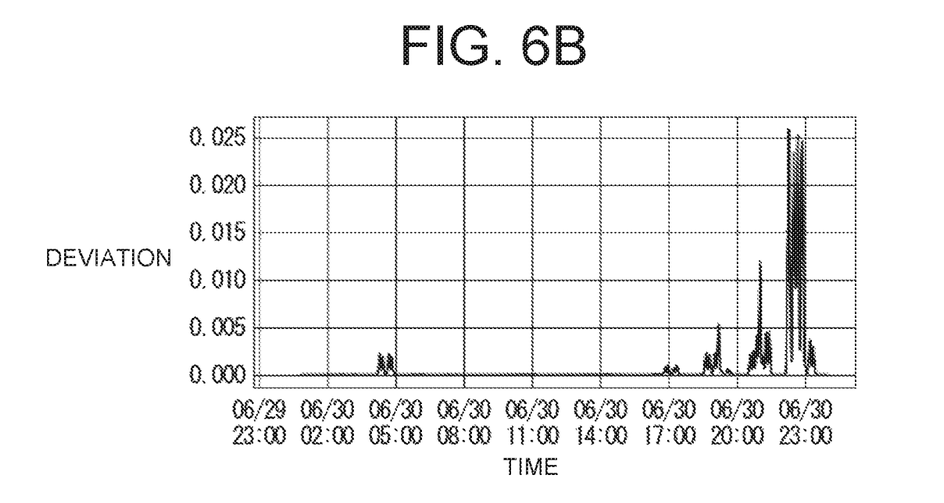

FIG. 6A is a graph showing an example of the online device count as a time series. FIG. 6B is a graph showing the deviation of the online device count in FIG. 6A as a time series.

The deviation detector 45a, based on using singular spectrum transformation on the online device count shown in FIG. 6A, calculates the deviation shown in FIG. 6B. When the deviation of the online device count shown in the graph of FIG. 6A is very small, such deviation is not reflected on the graph of FIG. 6B.

FIG. 6A and FIG. 6B show the results obtained about the deviation of the online device count, while similar results are obtained about the deviation of any other monitoring metric than the online device count.

The above description is made on the example, in which the deviation of a monitoring metric is calculated by using singular spectrum transformation. However, the deviation detector 45a may calculate the deviation of a monitoring metric with a method other than the method using singular spectrum transformation.

As shown in FIG. 5, after the processing of S61, the deviation detector 45a stores the deviation detected in S61 in the deviation history information 44c (S62) and ends the operations shown in FIG. 5.

Figure 7:
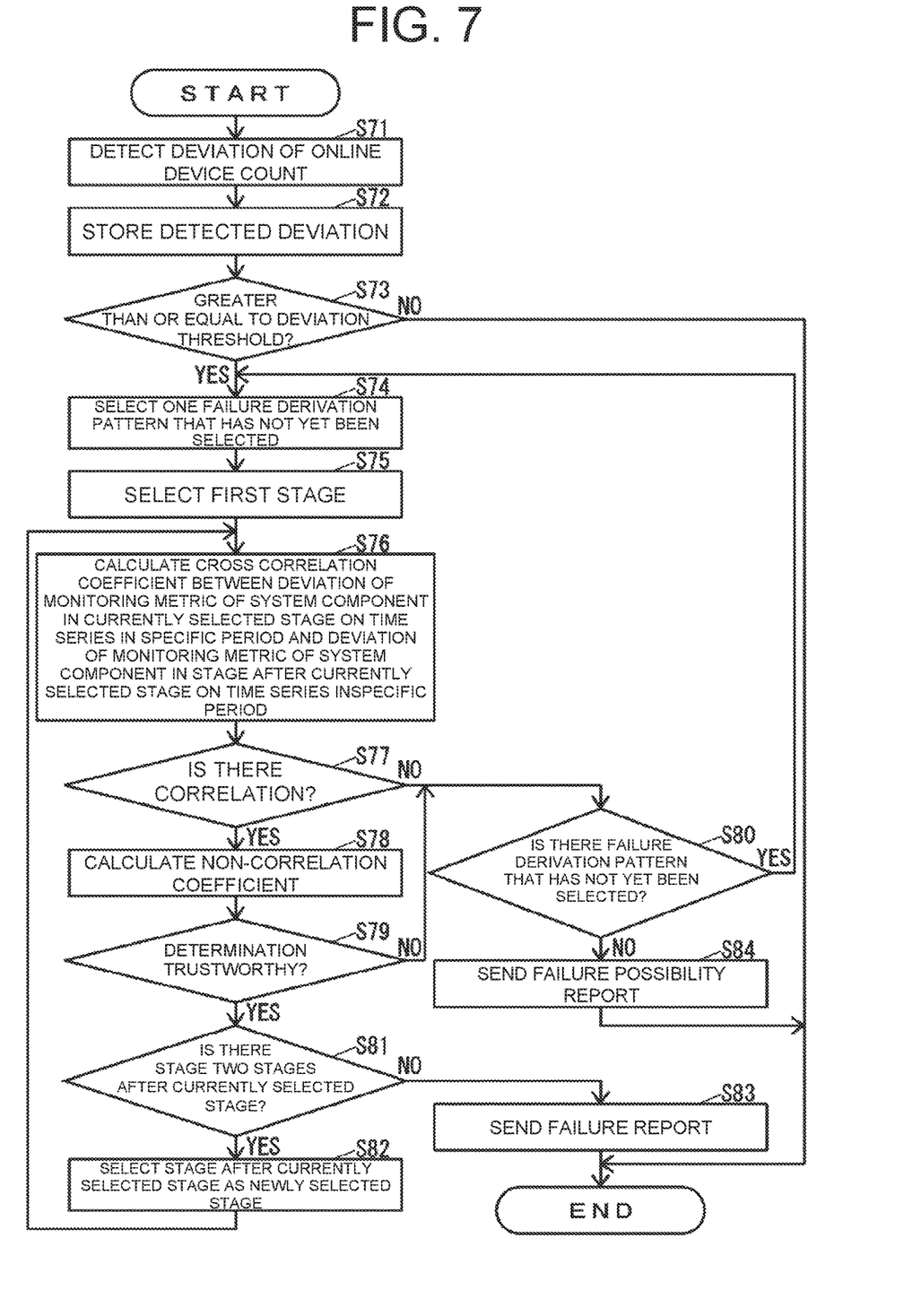

FIG. 7 is a flowchart showing the operations, which the monitoring system 40 takes when detecting the deviation of the online device count.

The controller 45 of the monitoring system 40 regularly executes the operations shown in FIG. 7.

As shown in FIG. 7, the deviation detector 45a detects a deviation of the online device count (S71) similarly to the processing in S61.

Next, the deviation detector 45a stores the deviation detected in S71 in the deviation history information 44c (S72) similarly to the processing in S62.

Next, the correlation determiner 45b determines whether the deviation detected in S71 is greater than or equal to the deviation threshold 44d (S73).

The correlation determiner 45b ends the operations shown in FIG. 7 when determining in S73 that the deviation detected in S71 is not greater than nor equal to the deviation threshold 44d.

When determining in S73 that the deviation detected in S71 is greater than or equal to the deviation threshold 44d, the correlation determiner 45b selects one failure derivation pattern, which has not yet been selected for the operations shown in FIG. 7, from among the failure derivation patterns contained in the failure detection information 44e (S74). When an ordered priority has been set for the failure derivation patterns contained in the failure detection information 44e, the correlation determiner 45b may select a failure derivation pattern based on the ordered priority.

After the processing of S74, the correlation determiner 45b selects the first stage of the derivation propagation pathway of the currently selected failure derivation pattern contained in the failure detection information 44e as a selected stage (S75).

Next, the correlation determiner 45b calculates, based on the deviation history information 44c, a cross correlation coefficient between the deviation of the monitoring metric of a system component in the currently selected stage contained in the failure detection information 44e, the deviation occurring on a time series in a specific period that includes the point in time when a deviation has been detected in S71, and the deviation of a monitoring metric of a system component in the stage after the currently selected stage contained in the failure detection information 44e, the deviation occurring on a time series in the specific period that includes the point in time when a deviation has been detected in S71 (S76). In the calculation of the cross correlation coefficient, not only a deviation at the point in time when a deviation has been detected in S71 but a deviation in a period including the point in time when a deviation has been detected in S71 is used. This is because the deviation of the monitoring metric of the system component in the stage after the currently selected stage may occur later than the deviation of the monitoring metric of the system component in the currently selected stage.

After the processing of S76, the correlation determiner 45b determines whether there is a correlation between the deviation of the monitoring metric of the system component in the currently selected stage and the deviation of the monitoring metric of the system component in the stage after the currently selected stage, based on the calculation of the cross correlation coefficient in S76 (S77). The correlation determiner 45b may determine that there is a correlation between the deviation of the monitoring metric of the system component in the currently selected stage and the deviation of the monitoring metric of the system component in the stage after the currently selected stage when the absolute value of the cross correlation coefficient is greater than or equal to 0.7, for instance. The correlation determiner 45b may instead determine that there is no correlation between the deviation of the monitoring metric of the system component in the currently selected stage and the deviation of the monitoring metric of the system component in the stage after the currently selected stage when the absolute value of the cross correlation coefficient is less than 0.7.

When determining in S77 that there is a correlation between the deviation of the monitoring metric of the system component in the currently selected stage and the deviation of the monitoring metric of the system component in the stage after the currently selected stage, the correlation determiner 45b calculates, based on the deviation history information 44c, a non-correlation coefficient between the deviation of the monitoring metric of the system component in the currently selected stage contained in the failure detection information 44e, the deviation occurring on a time series in the specific period that includes the point in time when a deviation has been detected in S71, and the deviation of the monitoring metric of the system component in the stage after the currently selected stage contained in the failure detection information 44e, the deviation occurring on a time series in the specific period that includes the point in time when a deviation has been detected in S71 (S78). In the calculation of the non-correlation coefficient, not only a deviation at the point in time when a deviation has been detected in S71 but a deviation in a period including the point in time when a deviation has been detected in S71 is used. This is because the deviation of the monitoring metric of the system component in the stage after the currently selected stage may occur later than the deviation of the monitoring metric of the system component in the currently selected stage.

The correlation determiner 45b then determines, based on the cross correlation coefficient calculated in S76 and the non-correlation coefficient calculated in S78, whether the determination made in S77 is trustworthy, that is, whether the determination is free from rejection at a significant level (S79).

When either determining in S77 that there is no correlation between the deviation of the monitoring metric of the system component in the currently selected stage and the deviation of the monitoring metric of the system component in the stage after the currently selected stage, or in S79 that the determination made in S77 is not trustworthy, the correlation determiner 45b then determines whether there is a failure derivation pattern that has not yet been selected for the operations shown in FIG. 7 among the failure derivation patterns contained in the failure detection information 44e (S80).

When determining in S80 that there is a failure derivation pattern that has not yet been selected for the operations shown in FIG. 7 among the failure derivation patterns contained in the failure detection information 44e, the correlation determiner 45b executes the processing of S74.

When determining in S79 that the determination made in S77 is trustworthy, the correlation determiner 45b then determines whether there is a stage two stages after the currently selected stage in the derivation propagation pathway of the currently selected failure derivation pattern contained in the failure detection information 44e (S81).

When determining in S81 that there is a stage two stages after the currently selected stage, the correlation determiner 45b selects the stage after the currently selected stage contained in the failure detection information 44e as a newly selected stage (S82) and executes the processing of S76.

When it is determined in S81 that there is not a stage two stages after the currently selected stage, the reporter 45c sends, to the contact address contained in the contact address information 44f, a failure report indicating that there is a failure in the remote management system 30 (S83). The failure report includes, for example, a report that it is determined from the deviations of the monitoring metrics of the system components such as the online device count that there is a failure in the remote management system 30.

When it is determined in S80 that there is not a failure derivation pattern that has not yet been selected for the operations shown in FIG. 7 among the failure derivation patterns contained in the failure detection information 44e, the reporter 45c sends, to the contact address contained in the contact address information 44f, a failure possibility report indicating that there is a possibility of a failure in the remote management system 30 (S84). The failure possibility report includes, for example, a report that it is determined from the deviations of the monitoring metrics of the system components such as the online device count that there is a possibility of no failure in the remote management system 30 in spite of the deviation of the online device count.

After both of the processing of S83 and the processing of S84, the reporter 45c ends the operations shown in FIG. 7.

As described above, the monitoring system 40 sends a failure report (S83) when the deviation of the online device count is greater than or equal to the deviation threshold 44d (YES in S73) and the monitoring system 40 determines that there is a correlation between the deviations in the monitoring metrics of the system components of the remote management system 30 (YES in S77). When the deviation of the online device count is less than the deviation threshold 44d (NO in S73), it is unnecessary for the monitoring system 40 to determine whether there is a correlation between the deviations in the monitoring metrics of the system components of the remote management system 30. As a result, failures the monitoring system 40 can reduce the burden of processing for reporting failures in the remote management system 30 failures.

Since the monitoring system 40 sends a failure report (S83) when the deviation of the online device count is greater than or equal to the deviation threshold 44d (YES in S73) and the monitoring system 40 determines that there is a correlation between the deviations in the monitoring metrics of the system components of the remote management system 30 (YES in S77), the monitoring system 40 can improve the trustworthiness of a failure report indicating a failure in the remote management system 30 that is sent when an abnormal deviation in the online device count has occurred.

The monitoring system 40 may detect the deviation in a monitoring metric other than the online device count as the deviation in the monitoring metric of the system component in the first stage in the derivation propagation pathway of the failure derivation pattern.

The monitoring system 40 is capable of detecting an abnormal deviation in a monitoring metric because the monitoring system 40 detects the deviation in a monitoring metric by using singular spectrum transformation on the monitoring metric (S61 and S71). Therefore, the monitoring system 40 can improve the trustworthiness of a failure report indicating a failure in the remote management system 30.

When the deviation in the online device count is greater than or equal to the deviation threshold 44d (YES in S73) and the monitoring system 40 determines that there is no correlation between the deviations in monitoring metrics of system components of the remote management system 30 (NO in S77), the monitoring system 40 sends not a failure report but a failure possibility report (S84). Thus the monitoring system 40 can improve the trustworthiness of a failure report indicating a failure in the remote management system 30.

Even when the deviation in the online device count is greater than or equal to the deviation threshold 44d (YES in S73) and the monitoring system 40 determines that there is a correlation between the deviations in monitoring metrics of system components of the remote management system 30 (YES in S77), the monitoring system 40 does not send a failure report if determining that the determination as above is not trustworthy (NO in S79). Thus the monitoring system 40 can improve the trustworthiness of a failure report indicating a failure in the remote management system 30.s

What is claimed is:

1. A monitoring system comprising:
   a deviation detector that detects deviations in metrics of a plurality of components of a specific system;
   a correlation determiner that, when the deviation detector detects a deviation in the metric of a specific component among the plurality of components to be subjected to a deviation detection by the deviation detector, determines whether the deviation in the metric of the specific component is greater than or equal to a specific threshold and determines whether there is a correlation between the deviations in the metrics of the plurality of components as detected by the deviation detector in accordance with the deviation in the metric of the specific component being greater than or equal to the specific threshold; and
   a reporter that sends a failure report indicating that there is a failure in the specific system in accordance with the correlation determiner making a determination that there is the correlation between the deviations in the metrics of the plurality of components.

2. The monitoring system according to claim 1, wherein:
   the specific system includes a system to perform remote management of electronic devices; and
   at least one metric of the specific component is an online device count as a number of electronic devices connected with the specific system.

3. The monitoring system according to claim 1, wherein the deviation detector detects the deviations in the metrics by using singular spectrum transformation on the metrics.

4. The monitoring system according to claim 1, wherein the reporter sends a failure possibility report indicating that there is a possibility of a failure in the specific system in accordance with the correlation determiner making a determination that there is no correlation between the deviations of the metrics of the plurality of components.

5. The monitoring system according to claim 1, wherein:
when the correlation determiner makes the determination that there is the correlation between the deviations in the metrics of the components as detected by the deviation detector, the correlation determiner determines whether the determination is trustworthy, based on the deviations in the metrics of the components; and
when the determination is determined, by the correlation determiner, not to be trustworthy, the reporter does not send the failure report even if the correlation determiner makes the determination that there is the correlation between the deviations in the metrics of the components.

6. A non-transitory computer-readable recording medium storing a monitoring program which, when executed by a computer, causes the computer to implement:
a deviation detector to detect deviations in metrics of a plurality of components of a specific system;
a correlation determiner to, when the deviation detector detects a deviation in the metric of a specific component among the components to be subjected to a deviation detection by the deviation detector, determines whether the deviation in the metric of the specific component is greater than or equal to a specific threshold and determine whether there is a correlation between the deviations in the metrics of the plurality of components as detected by the deviation detector in accordance with the deviation in the metric of the specific component being greater than or equal to the specific threshold; and
a reporter to send a failure report indicating that there is a failure in the specific system in accordance with the correlation determiner making a determination that there is the correlation between the deviations in the metrics of the plurality of components.

* * * * *